(12) United States Patent
Gombert et al.

(10) Patent No.: US 10,746,439 B2
(45) Date of Patent: Aug. 18, 2020

(54) DEVICE TO REGULATE THE RELATIVE HUMIDITY LEVEL IN A CPV MODULE

(71) Applicant: Saint-Augustin Canada Electric Inc., Saint-Augustin de Desmaures (CA)

(72) Inventors: Andreas Gombert, Freiburg (DE); Jakob Stor, Freiburg (DE); Cecile Taliercio, Freiburg (DE)

(73) Assignee: Saint-Augustin Canada Electric Inc., Saint-Augustin, Quebec (CA)

( * ) Notice: Subject to any disclaimer, the term of this patent is extended or adjusted under 35 U.S.C. 154(b) by 788 days.

(21) Appl. No.: 14/770,403

(22) PCT Filed: Feb. 12, 2014

(86) PCT No.: PCT/EP2014/000389
§ 371 (c)(1),
(2) Date: Aug. 25, 2015

(87) PCT Pub. No.: WO2014/131492
PCT Pub. Date: Sep. 4, 2014

(65) Prior Publication Data
US 2016/0003497 A1    Jan. 7, 2016

(30) Foreign Application Priority Data
Feb. 26, 2013    (FR) ...................... 13 51665

(51) Int. Cl.
*F24F 3/14*    (2006.01)
*F24S 40/42*    (2018.01)
(Continued)

(52) U.S. Cl.
CPC ............... *F24S 40/42* (2018.05); *F24S 40/57* (2018.05); *H01L 31/18* (2013.01); *H02S 40/00* (2013.01); *Y02E 10/40* (2013.01); *Y02E 10/50* (2013.01)

(58) Field of Classification Search
CPC ......... F24J 2/4618; H01L 31/18; Y02E 10/40; G05D 22/00; G05D 22/02; F24S 40/42; H02S 40/00
See application file for complete search history.

(56) References Cited

U.S. PATENT DOCUMENTS 6,220,039 B1 *  4/2001  Kensok ............... F24F 11/0008
                                                  62/93
6,295,864 B1 * 10/2001  You ........................ G01N 1/22
                                                  73/53.01
(Continued)

FOREIGN PATENT DOCUMENTS

CN    1140250 A    1/1997
CN    201866877 U  6/2011
(Continued)

OTHER PUBLICATIONS

Chinese Office Action for Chinese Application No. 201480010379.2 dated Oct. 17, 2016, 9 pages.
(Continued)

*Primary Examiner* — Henry T Crenshaw
*Assistant Examiner* — Kamran Tavakoldavani
(74) *Attorney, Agent, or Firm* — TraskBritt (57) ABSTRACT

A device to regulate the relative humidity level inside a CPV module, the device comprising a desiccant unit connected to the module via a duct, the module is also connectable to ambient atmosphere and the device comprises a switching mechanism that is actuated by a regulation unit, allowing a gas flow between the module and either the desiccant unit or ambient atmosphere. The air into the CPV module is let through a dehumidifier only when there is risk of condensation, which is determined from values of the air inside and/or outside the module by sensors sensing temperature (Continued)

and/or relative humidity and comparing these to thresholds or to the calculated dew temperature inside the module.

24 Claims, 7 Drawing Sheets

(51) Int. Cl.
*H02S 40/00* (2014.01)
*F24S 40/57* (2018.01)
*H01L 31/18* (2006.01)

(56) References Cited

U.S. PATENT DOCUMENTS

| | | | | |
|---|---|---|---|---|
| 7,014,932 | B2* | 3/2006 | Halter | H01M 8/04156 204/DIG. 4 |
| 2008/0061156 | A1* | 3/2008 | Goedde | H04N 5/00 236/44 A |
| 2009/0269632 | A1* | 10/2009 | Senft | H01M 8/04126 429/413 |
| 2010/0050666 | A1* | 3/2010 | Meyer | B01D 53/261 62/94 |
| 2011/0154683 | A1* | 6/2011 | Vogt | H01L 31/18 34/418 |
| 2012/0103187 | A1* | 5/2012 | Roa Fresno | F24J 2/085 95/23 |
| 2013/0036909 | A1* | 2/2013 | Menard | B01D 53/261 95/91 |

FOREIGN PATENT DOCUMENTS

| | | |
|---|---|---|
| CN | 103187901 A | 7/2013 |
| CN | 103703570 A | 4/2014 |
| EP | 0546481 A | 6/1993 |
| WO | 2009146842 A1 | 12/2009 |
| WO | 2011085086 A2 | 7/2011 |

OTHER PUBLICATIONS

International Search Report for International Application No. PCT/EP2014/000389 dated Jul. 1, 2014, 4 pages.
European Office Action for European Application No. 14705032.2 dated May 17, 2017, 5 pages.
International Written Opinion for International Application No. PCT/EP2014/000389 dated Jul. 1, 2014, 5 pages.
Chinese Second Office Action for Chinese Application No. 201480010379.2 dated May 22, 2017, 8 pages.
Canadian Office Action for Canadian Application No. 2,940,863 dated Jun. 30, 2017, 3 pages.
Canadian Second Office Action for Canadian Application No. 2,940,863 dated Apr. 16, 2018, 4 pages.
Chinese Search Report for Chinese Application No. 201480010379, dated Sep. 30, 2016, 1 page.
Anonymous: "Condensation-Wikipedia", Feb. 3, 2013 (Feb. 3, 2013), XP055445107, Retrieved from the Internet: URL:https://en.wikipedia.org/w/index.php?title=Condensation&oldid=536277444 [retrieved on Jan. 26, 2018].

* cited by examiner

# DEVICE TO REGULATE THE RELATIVE HUMIDITY LEVEL IN A CPV MODULE

CROSS-REFERENCE TO RELATED APPLICATIONS

This application is a national phase entry under 35 U.S.C. § 371 of International Patent Application PCT/EP2014/000389, filed Feb. 12, 2014, designating the United States of America and published in English as International Patent Publication WO 2014/131492 A1 on Sep. 4, 2014, which claims the benefit under Article 8 of the Patent Cooperation Treaty and under 35 U.S.C. § 119(e) to French Patent Application Serial No. 1351665, filed Feb. 26, 2013, the disclosure of each of which is hereby incorporated herein in its entirety by this reference.

TECHNICAL FIELD

This disclosure relates generally to a device and a method for regulating the relative humidity level inside a solar cell module. The device and the method are particularly well suited for concentrator photovoltaic (CPV) modules.

BACKGROUND

In CPV modules, the incident light, in particular, the solar radiation, is concentrated on a photovoltaic cell by an optical system comprising, e.g., a mirror or a lens, such as a Fresnel lens or a spherical lens. The cell is thereby positioned at the focus of the lens. Commonly, such CPV modules are mounted, alone or combined in arrays, on tracking units in order to be optimally oriented toward the incident light, in particular, following the brightest region in the sky. Preferably, CPV modules should be sealed completely to avoid degrading of the solar cells and other electrical components, e.g., the bypass diodes or the electrical wiring, due to environmental influences. In particular, an elevated level of relative humidity in the module, which can cause, under certain circumstances, condensation of water vapor on the components situated inside the module.

Several prior art approaches for resolving the problem of condensation and humidity inside a solar module are known. A first approach is based on a completely sealed solar module. Prior art document WO 2011/085086 A2 discloses an entirely sealed solar module in which the solar module is connected to an expansion bag accommodating for the pressure changes inside a solar module during thermal cycling. Optionally, a supplemental desiccant unit is installed to remove moisture that has penetrated into the sealed module. This approach is not well adapted to large CPV modules and plants, due to the huge dimensioning of the expansion bag.

In another approach, disclosed in prior art document WO 2009/146842 A1, an adsorber or desiccant unit is connected to the module, whose role is to dry the incoming air. Adsorption is a phenomenon leading to the physico-chemical fixation of molecules of water vapor on the surface of a solid, in particular, an adsorber or desiccant material, such as, for instance, a silica gel that is characterized by a high porosity. Moist air from outside the module is blown with a fan through the adsorber unit, in particular, containing a silica gel as an adsorber material, which absorbs excess moisture, and dried air is sent directly to the CPV modules. However, with time, the adsorbent becomes saturated and must be regenerated to remove moisture. This regeneration generally takes place when the relative humidity measured after the adsorbent unit is above a certain limit, and the regeneration duration depends on this relative humidity level. This regeneration is ensured by the passage of air heated to a temperature above 60° C. and the moist hot air has to be evacuated outside.

This regeneration phase is highly energy consuming and needs an active device assuring the flow of air, in particular, a fan. Moreover, lack of supervisory control and communication leads to an unnecessary use of the drying unit, even when the outside meteorological conditions are optimal in avoiding dry modules, in particular, elevated outside temperature and low relative humidity outside the module.

BRIEF SUMMARY

The objective of the disclosure is to propose a device and a method for regulating the relative humidity level inside a solar cell module obviating the above-mentioned detriments.

In particular, this disclosure relates to a device to regulate the relative humidity level in a CPV module, the device comprising a desiccant unit connected to the module via a duct, the module also being connectable to ambient atmosphere, the device comprising a switching mechanism that is actuated by a regulation unit, allowing a gas flow between the module and either the desiccant unit or ambient atmosphere.

This regulation enables one to limit the use of the desiccant unit and, thus, reduce energy consumption due to the regeneration phase and also by decreasing the use of the desiccant unit, one prevents precipitate saturation of the latter. By adjusting the capacity of the desiccant unit, it is possible to create a self-correcting and maintenance-free humidity regulation unit for a CPV system containing at least one module.

In further advantageous embodiments, the regulation unit of the humidity-regulating device comprises at least a sensor adapted to measure physical values with reference to the inside of the module or at least a sensor adapted to measure physical values with reference to the outside of the module, and in which the regulation unit records and compares the measures with predetermined thresholds to actuate the switching mechanism.

In further advantageous embodiments, the regulation unit of the humidity-regulating device comprises at least a sensor adapted to measure physical values with reference to the inside of the module and at least a sensor adapted to measure physical values with reference to the outside of the module, and in which the regulation unit records and compares their measures to actuate the switching mechanism. The physical values measured can be, respectively, the temperature, relative humidity, and pressure, inside and outside the module.

These two embodiments provide the beneficial effect that an intelligent regulation of the humidity-regulating device is made possible, in particular, by taking into account any possible environmental factors, in particular, thermodynamic parameters directly related to condensation, relevant for the good functionality of a CPV system.

In further advantageous embodiments, the module of the humidity-regulating device is connected to ambient atmosphere via a second duct connected to the first duct at an intersection, the switching mechanism comprising a first valve placed on the first duct between the desiccant unit and the intersection, and comprising a second valve placed on the second duct between the intersection and the ambient atmosphere.

In an alternative embodiment, the module of the humidity-regulating device is connected to ambient atmosphere via a second duct connected to the first duct at an intersection, the switching mechanism comprising an L-valve placed at the intersection.

These two embodiments provide the beneficial advantage that the same connection of the desiccant unit to the module can be used for both types of gas flow, the one between the desiccant unit and the module and the one between ambient atmosphere and the module. Thus, only one entrance or opening is needed on the side of the module.

In an alternative embodiment, the module of the humidity-regulating device is connected to ambient atmosphere via an opening placed on the module, the switching mechanism comprising valves placed on the first duct and the opening.

In further advantageous embodiments, the humidity-regulating device further comprises a non-return membrane placed on at least one of the module units able to evacuate overpressure from inside the module to ambient atmosphere.

This provides the beneficial advantage that a gas flow could be allowed between the module and ambient atmosphere while the desiccant unit could be disconnected for maintenance reasons. Maintenance efforts are, therefore, reduced as no stop of the system is required.

In further advantageous embodiments, the humidity-regulating device allows the gas flow between the module and the desiccant unit when the regulation unit records a pressure in the module inferior to the pressure outside the module and the temperature inside or outside the module is lower than the predetermined temperature threshold and/or the relative humidity inside or outside the module is higher than the predetermined relative humidity threshold.

In further advantageous embodiments, the humidity-regulating device allows the gas flow between the module and ambient atmosphere when the regulation unit records a pressure in the module inferior to the pressure outside the module and the temperature inside or outside the module is higher than the predetermined temperature threshold and/or the relative humidity inside or outside the module is lower than the predetermined relative humidity threshold.

These two embodiments provide the beneficial advantage that with only one sensor present to measure physical values inside or outside the module an efficient savings on the desiccant unit can be obtained.

In further advantageous embodiments, the humidity-regulating device allows the gas flow between the module and the desiccant unit when the regulation unit records a pressure in the module inferior to the pressure outside the module and a temperature outside the module, which is approaching the dew point temperature inside the module, the dew point being calculated from the measure of the temperature and relative humidity inside the module, from higher temperatures by less than a predetermined threshold, preferentially 2° C.

This provides the beneficial advantage that no active device is needed to support a gas flow, but the depression inside the module triggers the gas flow of dried air from the desiccant unit to the module when the temperature outside the module is colder than the dew point temperature plus a predetermined threshold, in particular, 2° C.

In further advantageous embodiments, the humidity-regulating device allows the gas flow between the module and the ambient atmosphere when the regulation unit records a pressure in the module inferior to the pressure outside the module and the outside temperature is exceeding the dew point temperature inside the module, the dew point being calculated from the measure of the temperature and relative humidity inside the module, by more than a predetermined threshold, preferentially 2° C.

This provides the beneficial advantage that the desiccant unit is not used and gas flow to the module, induced by the depression in the module, is allowed when the meteorological conditions are favorable, in particular, the temperature outside the module is higher than the dew point temperature plus a predetermined threshold, in particular, 2° C. A use to a lesser extent of the desiccant unit reduces the need of regeneration. By keeping a certain frequency of regeneration, much less desiccant material can be used and, thus, one can benefit from longer maintenance-free periods.

In further advantageous embodiments, the humidity-regulating device allows the gas flow between the module and the ambient atmosphere when the regulation unit records a pressure in the module superior to the pressure outside the module.

This provides the beneficial advantage that overpressure in the module is evacuated from the system without need of any active flow or pump device.

In further advantageous embodiments, the humidity-regulating device allows the gas flow between the module and the desiccant unit when the regulation unit records a pressure in the module inferior to the pressure outside the module and the outside temperature is exceeding the dew point temperature inside the module, the dew point being calculated from the measure of the temperature and relative humidity inside the module, by more than a predetermined threshold, preferentially 2° C., and the relative humidity level outside the module exceeds a predetermined threshold, preferentially 70%.

In further advantageous embodiments, the humidity-regulating device allows the gas flow between the module and the ambient atmosphere when the regulation unit records a pressure in the module inferior to the pressure outside the module and the outside temperature is exceeding the dew point temperature inside the module, the dew point being calculated from the measure of the temperature and relative humidity inside the module, by less than a predetermined threshold, preferentially 2° C., and the relative humidity level outside the module is inferior to a predetermined threshold, preferentially 70%.

These two embodiments provide the beneficial advantage that not only the dew point temperature can be taken into account to regulate the gas flow, but one decouples the second parameter relative humidity from the mixed parameter dew point temperature.

In further advantageous embodiments, the desiccant unit of the humidity-regulating device comprises an opening to ambient atmosphere, the opening comprising a third valve, which is opened only when the gas flow is allowed between the module and the desiccant unit.

In an alternative embodiment, the desiccant unit of the humidity-regulating device comprises an opening to ambient atmosphere, the opening comprising a non-return valve.

These two embodiments provide the beneficial advantage that for the desiccant unit that a breathing mode is possible between the module and ambient atmosphere, with the desiccant unit switched in between whenever the meteorological conditions require humidity regulation inside the module.

In further advantageous embodiments, a particle filter is placed on at least one of the connections to ambient atmosphere.

This provides the beneficial advantage that the functionality of the system is increased, in particular, by avoiding particles sensitive to the relative humidity that could damage the electrical components of the module.

In further advantageous embodiments, the desiccant unit of the humidity-regulating device contains absorber and/or adsorber materials, in particular, silica gel.

This latter provides the beneficial advantage that the high porosity material of the silica gel optimizes the adsorption performance of the desiccant unit and, thus, less amount of material is needed with respect to other generally used materials.

In further advantageous embodiments, at least one module unit of the module is connected in a gas-conducting manner via a duct.

This provides the beneficial advantage that either the module units can be connected with each other and, thus, in a grouped manner to the desiccant unit and/or individually, via, for instance, a central tubing system that addresses each module unit individually, in order to be regulated by the switching mechanism.

Further, this disclosure can also relate to a humidity-regulating process using the humidity-regulating device, in particular, adapted for modules used for CPV.

BRIEF DESCRIPTION OF THE DRAWINGS

The disclosure will be described in more detail by way of example hereinafter using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be left out.

DETAILED DESCRIPTION

This disclosure will now be described with reference to specific embodiments. It will be apparent to the skilled person that features and alternatives from any of the embodiments can be combined, independently of each other, with features and alternatives of any other embodiment in accordance with the scope of the claims.

Figure 1A:
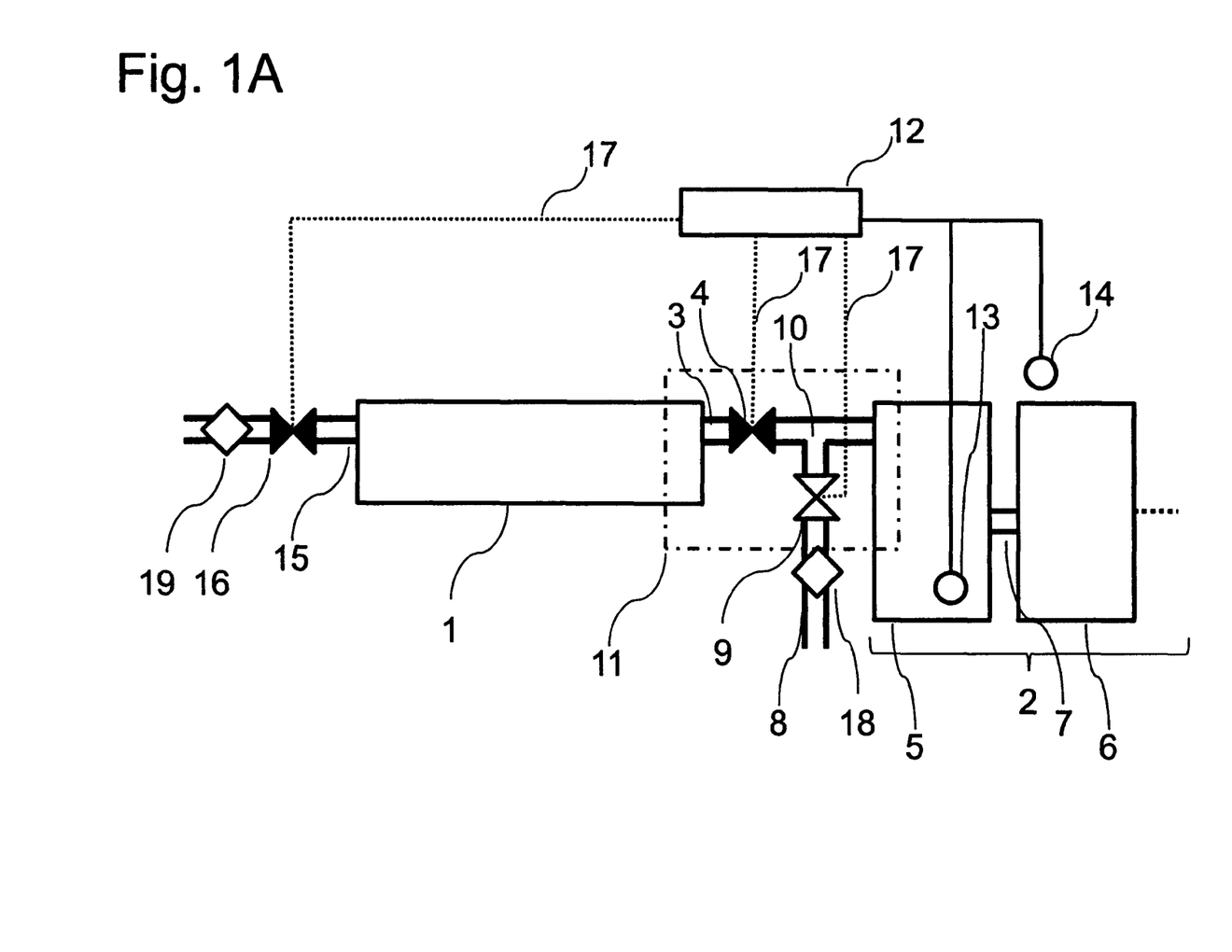
FIGS. 1A-1D schematically illustrate a humidity-regulating device in accordance with preferred embodiments of this disclosure.
Figure 1B:
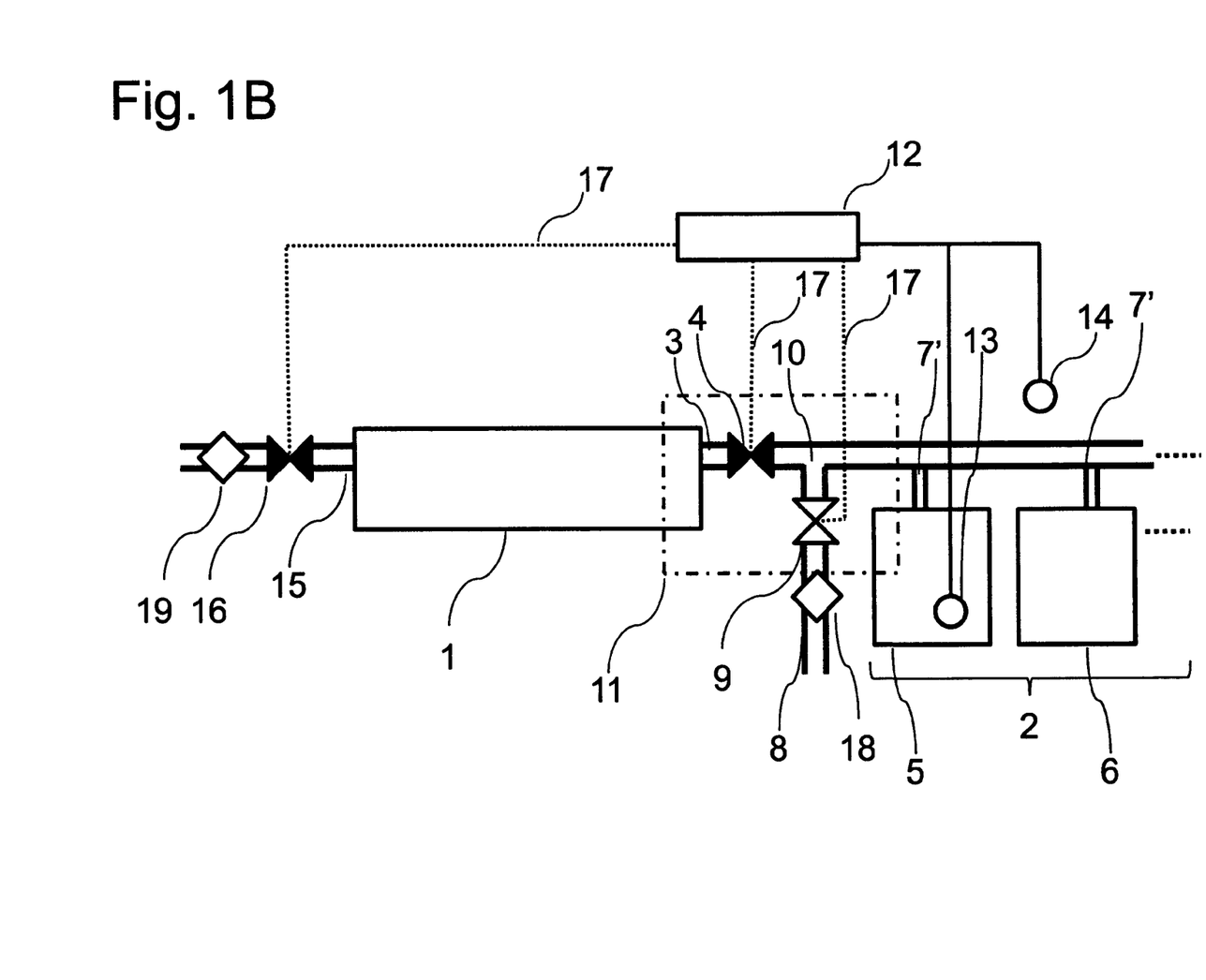

In particular, FIGS. 1A and 1B schematically illustrate a device to regulate the relative humidity level in a CPV module. The module 2 consists of at least one module unit 5. FIG. 1A schematically illustrates that module 2 comprises at least a module unit 5 and a module unit 6, which are connected in a gas-conducting manner via duct 7. FIG. 1B schematically illustrates that module 2 comprises at least a module unit 5 and a module unit 6, which are connected in a gas-conducting manner via ducts 7'. However, the disclosure is not limited thereto and further module units may be included and connected in either the way displayed in FIG. 1A and/or the way displayed in FIG. 1B. This allows one to individually address module units (5, 6, . . . ) or groups of module units via a central gas line tubing system.

The device comprises a desiccant unit 1 connected to the module 2 via a first duct 3 on which is placed a first valve 4. The desiccant unit 1 can, for instance, contain absorber and/or adsorber material, in particular, silica gel.

The module 2 is also connected to ambient atmosphere via a second duct 8 on which is placed a second valve 9. The second duct 8 connects to the first duct 3 at an intersection 10. The first valve 4 on the first duct 3 is situated between the desiccant unit 1 and the intersection 10. A switching mechanism is actuated by a regulation unit 12, which allows gas flow between the module 2 and either the desiccant unit 1 or ambient atmosphere. In a non-limitative way, the desiccant unit 1 is connected to ambient atmosphere via a third duct 15 on which is placed a third valve 16.

The device according to the disclosure includes at least one sensor 13 adapted to measure physical values with reference to the inside of the module 2 and/or at least one sensor 14 adapted to measure physical values with reference to the outside of the module 2 connected to the regulation unit 12. As schematically illustrated, the regulation unit 12 acts on a switching mechanism 17 as indicated by dashed lines, thereby using the information inside the module 2 from the sensor 13 and/or outside the module 2 from the sensor 14. The switching mechanism 17 comprises the first valve 4 and the second valve 9, or any other valve necessary in order to allow a gas flow between the module 2 and either the desiccant unit 1 or ambient atmosphere. A skilled person knows how to implement the connection to the switching mechanism 17 and the sensors 13, 14, for example, either by simple wire connection or wireless communication.

The openings to ambient atmosphere are equipped with particle filters 18 and 19.

The regulation unit 12 and the switching mechanism 17 assure that a connection allowing gas flow is established between the module 2 and either the desiccant unit 1 or ambient atmosphere. This is schematically illustrated in FIG. 1A in that the first valve 4 on the first duct 3 and the third valve 16 on the third duct 15 are filled in black in order to show a closed position, for instance, of the valves 4, 16, and the second valve 9 on the second duct 8 is filled in white in order to show an open position of the valve 9, respectively. Gas flow is allowed between the module 2 and ambient atmosphere. This is, in particular, useful whenever the meteorological conditions indicate that there is no risk for condensation inside the module 2 by incoming air that is not passed by the desiccant unit 1 to dry the air on purpose. The regulation unit 12 uses the information inside the module 2 of sensors 13 and/or outside the module 2 of sensors 14 in order to decide whether to allow gas flow between the module 2 and ambient atmosphere or to allow gas flow between the module 2 and the desiccant unit 1. Comparing measures outside and inside the module permits a perfect evaluation of necessity to dry the incoming air.

FIG. 1A illustrates that whenever the first valve 4 on first duct 3 is actuated, this is also the case in the same manner for the third valve 16 on the third duct 15, which connects the desiccant unit 1 to ambient atmosphere. A gas flow from ambient atmosphere to the module 2 occurs via the desiccant unit 1, for instance, provoked by a depression inside the module 2, allowing dried air flow to the module 2 without any active transportation means, such as a fan.

In an alternative, the third valve 16 on the third duct 15 could be a non-return valve, preventing gas flow from the desiccant unit 1 to ambient atmosphere. The non-return valve allows gas flow from ambient atmosphere to the desiccant unit 1 and, thus, dried air flow from the desiccant unit 1 to the module 2 via the first duct 3 and opens first valve 4 whenever depression occurs in the module 2 and the regulation unit 12 opens the first valve 4 to the desiccant unit 1.

The regulation unit 12 evaluates, for instance, the risk of condensation inside the module 2 by the measures of various parameters of the sensors 13 adapted to measure physical values with reference to the inside of the module and/or the sensors 14 adapted to measure physical values with reference to the outside of the module and controls the gas flow. Physical parameters, such as, for instance, pressure, temperature and relative humidity are most suitable, but one can also add further elements, such as, for instance, time and tracker position. Taking into account these thermodynamic parameters for the regulation of the gas flow enables one to perfectly control and avoid the occurrence of condensation. Further, the sensors 13, 14 do not have to be physically situated inside or outside the module 2, such as, for instance, the case of an optically controlled measurement of the temperature through the transparent lens or bottom plate for CPV applications. Sensor 13 could be placed, for instance, in the central gas line tubing system, displaying a common information on physical values of all connected modules at once.

Figure 2A:
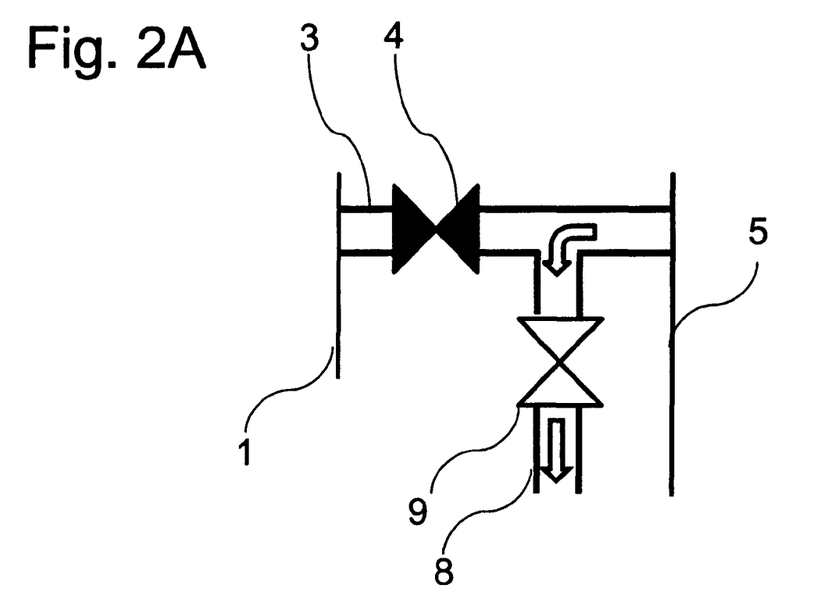
FIGS. 2A-2C schematically illustrate the switching mechanism of a humidity-regulating device in accordance with embodiments of this disclosure.
Figure 2B:
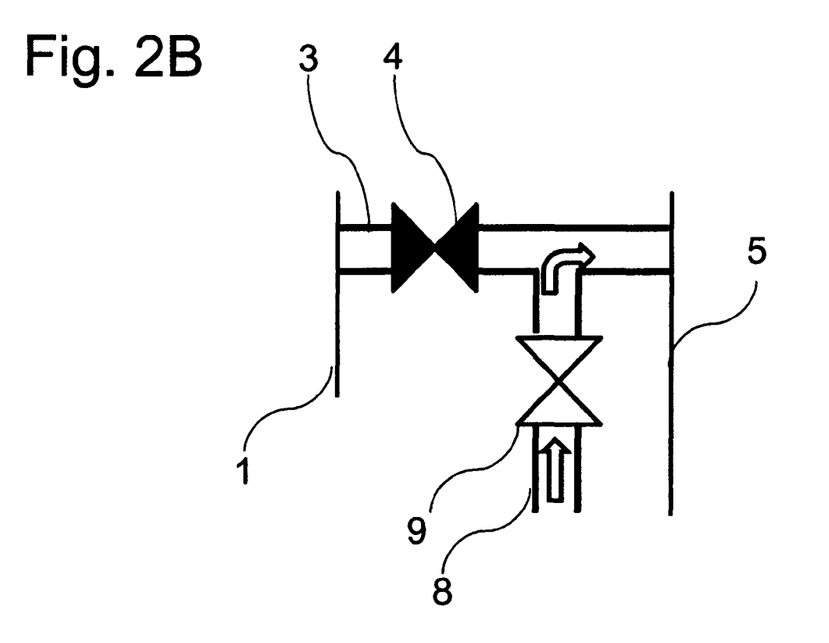
Figure 2C:
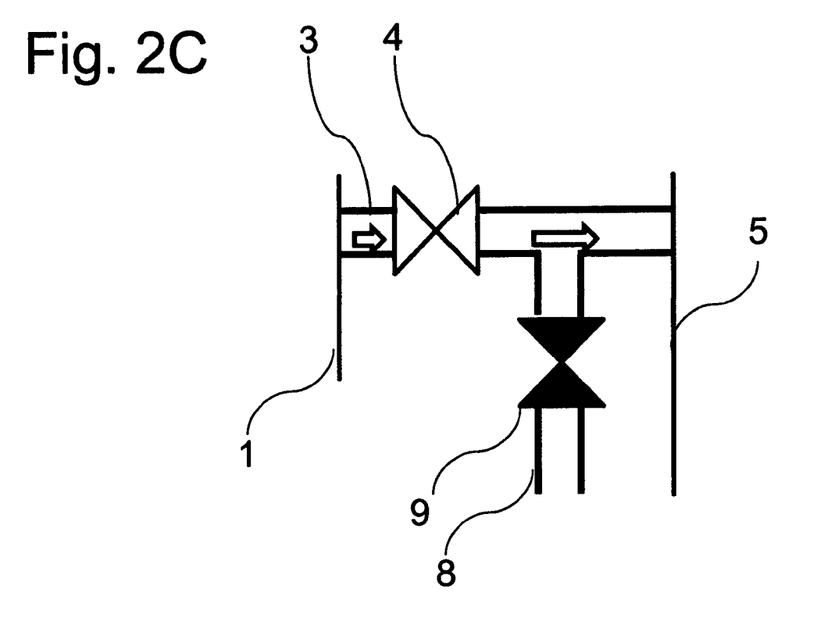

FIGS. 2A-2C schematically illustrate the switching mechanism of a humidity-regulating device according to embodiments of this disclosure and correspond to frame 11 of FIGS. 1A and 1B.

FIGS. 2A and 2B schematically illustrate that the first valve 4 on the first duct 3 is filled in black, corresponding to a closed position of the valve, while the second valve 9 on the second duct 8 is filled in white, corresponding to an open position, respectively. In both cases, the module unit 5 is connected to ambient atmosphere via second duct 8 and second valve 9.

FIG. 2A schematically illustrates the gas flow going from the module unit 5 to ambient atmosphere. This is possibly provoked by an overpressure inside the module unit 5. In order to equilibrate the difference in pressure inside the module unit 5 with respect to the pressure outside the module unit 5, the gas is flowing from the module unit 5 to ambient atmosphere. Gas is expulsed from the module unit 5 and no ambient air flows to the module unit 5.

FIG. 2B schematically illustrates the gas flow going from ambient atmosphere to the module unit 5. Ambient air flows to the module unit 5 without passing through the desiccant unit 1. This is possibly provoked by a depression inside the module unit 5. In order to equilibrate the difference in pressure inside the module unit 5 with respect to the pressure outside the module unit 5, the gas is flowing from ambient atmosphere to the module unit 5. As already mentioned, this operating mode is particularly useful whenever the meteorological conditions indicate that there is no risk for condensation inside the module unit 5. It is thus possible to limit the use of the drying functionality of the desiccant unit 1 to certain conditions, in particular, meteorological conditions with risk for condensation.

FIG. 2C schematically illustrates the gas flow going from the desiccant unit 1 to the module unit 5 via the first duct 3 and the first valve 4. Dried air from the desiccant unit 1 is provided to the module unit 5 in order to regulate the relative humidity level inside the module unit 5, in particular, to avoid condensation inside the module unit 5. The flow is possibly provoked by a depression inside the module unit 5. In order to equilibrate the difference in pressure inside the module unit 5 with respect to the pressure outside the module unit 5, the gas is flowing from the desiccant unit 1 to the module unit 5.

Figure 1C:
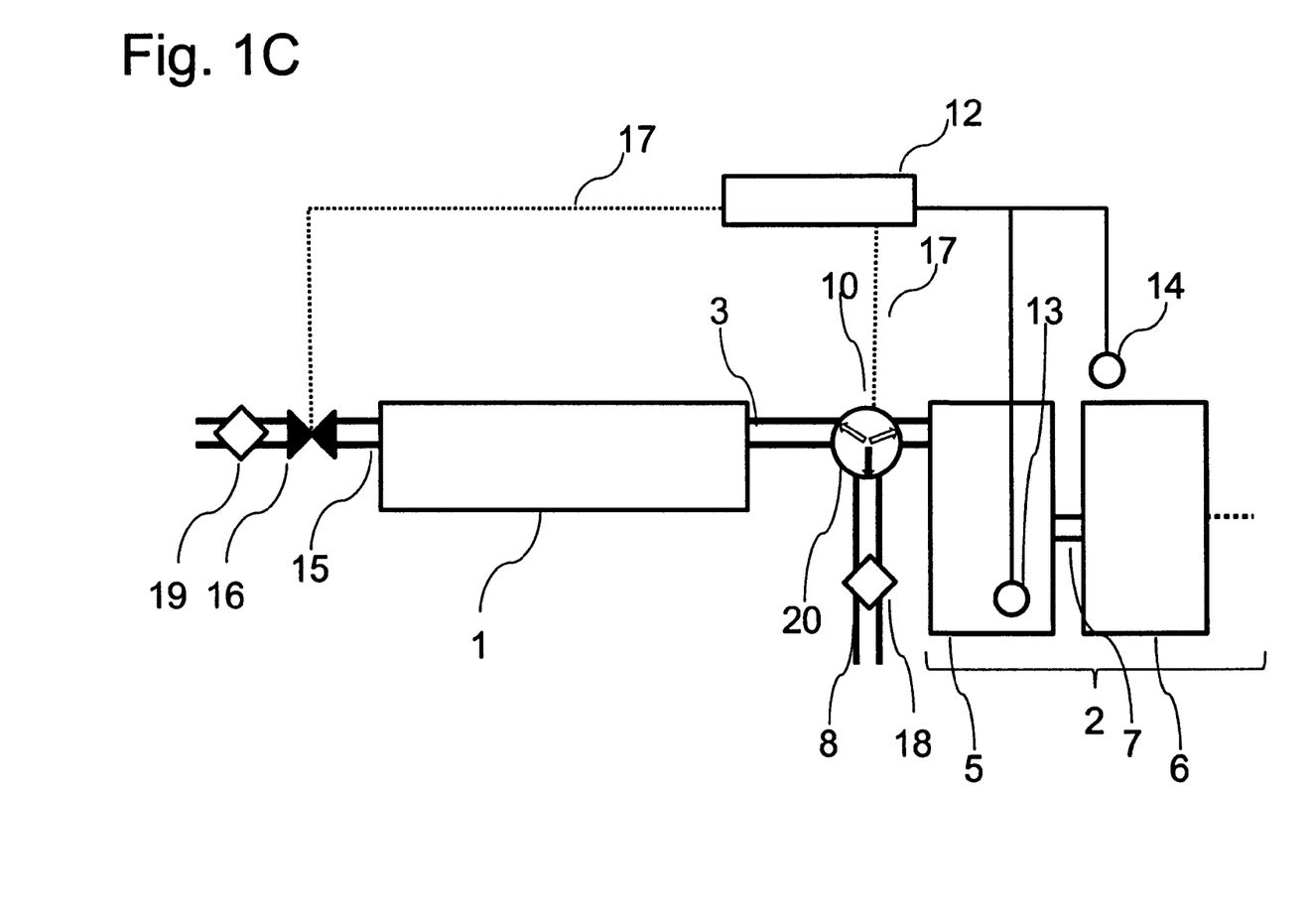

In an alternative, shown in FIG. 1C, both the first valve 4 on the first duct 3 and the second valve 9 on the second duct 8 can be replaced by a single valve of type L-valve 20, placed at the intersection 10 of the first duct 3 and the second duct 8, allowing in the shown case (the filled in black arrow indicates the closed position for the respective part to ambient atmosphere) the gas flow from the module unit 5 to the desiccant unit 1 via the first duct 3, controlled by the regulation unit 12. The use of the L-valve 20 not only allows a gas connection between the module unit 5 and the desiccant unit 1 as well as between the module unit 5 and ambient atmosphere, but also a gas connection can be established between the desiccant unit 1 and ambient atmosphere while the entrance to the module unit 5 is closed for gas flow. This would allow an easy access to connect a regeneration unit to the desiccant unit 1, which would reduce fixed installation costs and efforts for such a maintenance action.

Figure 1D:
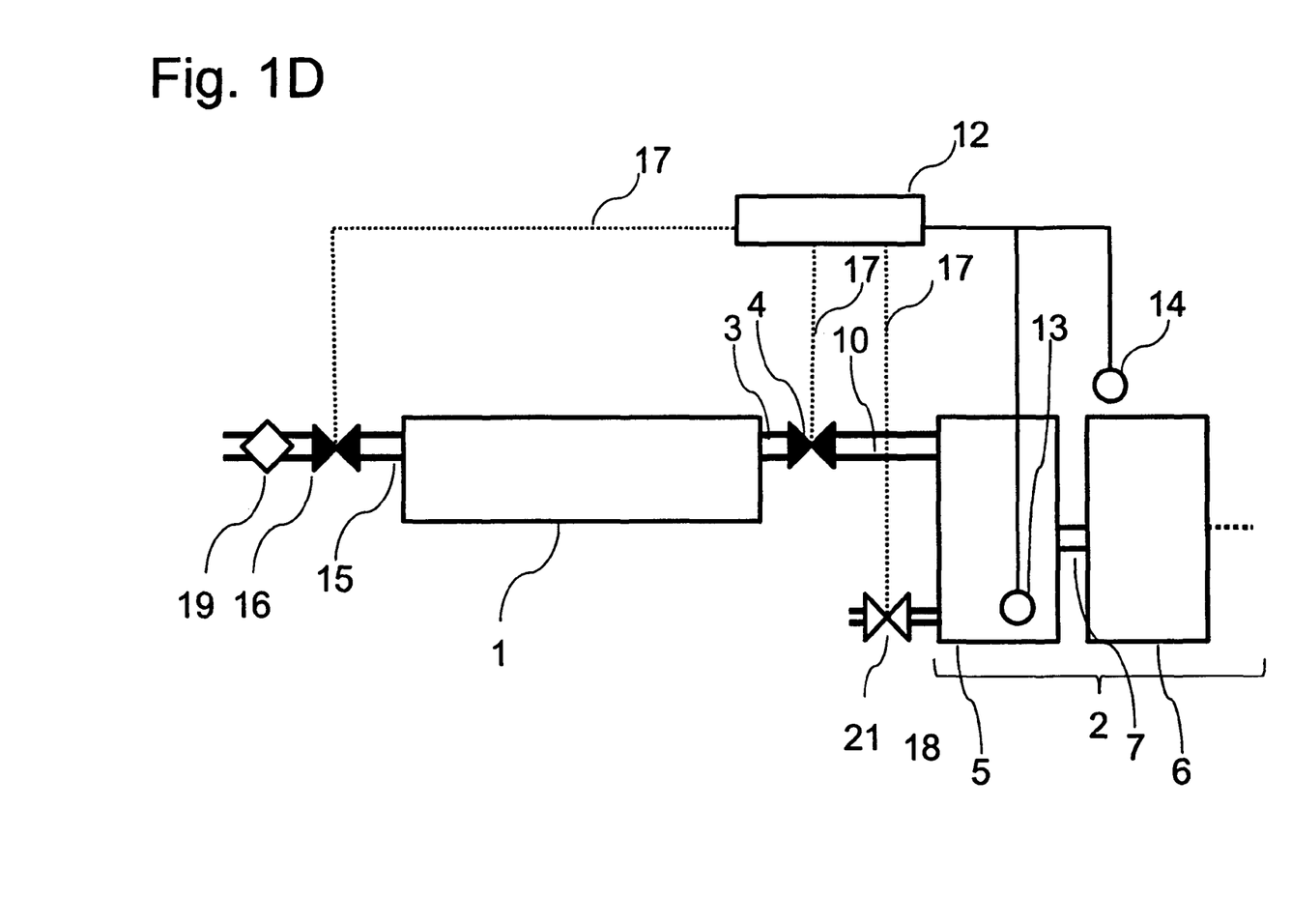

In an alternative, the module unit 5 is not connected to ambient atmosphere via the second duct 8 and second valve 9, but via an opening situated independently of the first duct 3 elsewhere on the module 2, with another valve 21 placed on this opening, as illustrated in FIG. 1D as placed on the module unit 5. However, the disclosure is not limited to this. Whenever gas flow between the module 2 and ambient atmosphere is allowed, the valve on the opening of the module unit 5 is opened whereas the first valve 4 on the first duct 3 is closed, and vice versa. This gives the advantage that a breathing mode between the module unit 5 and ambient atmosphere can be maintained while maintenance is performed on the connected desiccant unit 1.

In an alternative, at least one of the module units (5, 6, . . . ) can further comprise a non-return membrane that allows evacuation of an eventual overpressure inside the module to ambient atmosphere. This additional element has the further advantage that it is automatically switched or addressed and sustains the simple working principle of the humidity-regulating device.

Figure 3:
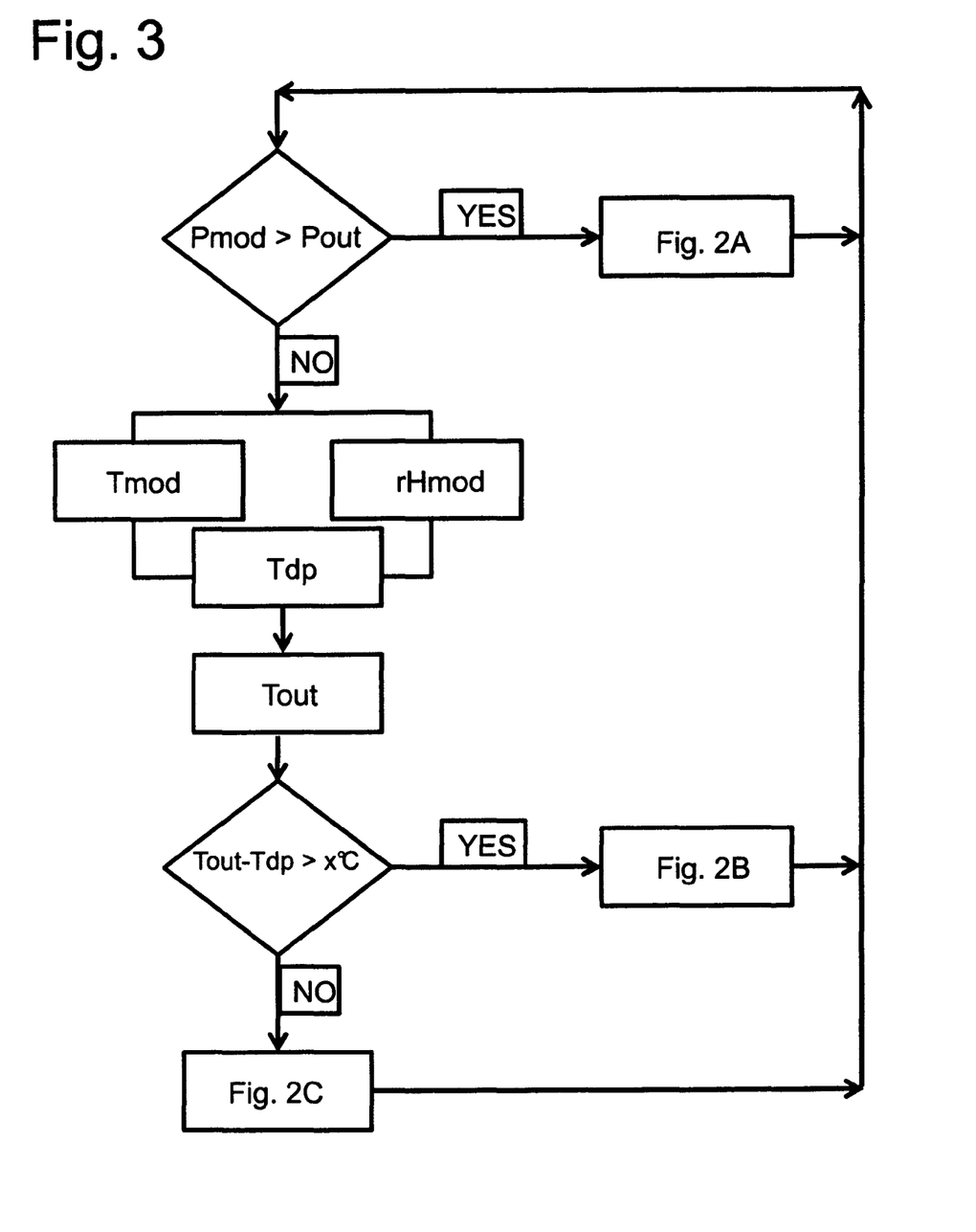
FIG. 3 schematically illustrates the working principle of a humidity-regulating device in accordance with embodiments of this disclosure.

FIG. 3 schematically illustrates the working principle of a humidity-regulating device according to embodiments of this disclosure. With reference to FIGS. 1A to 1D, schematically representing one sensor 13 adapted to measure physical values inside the module unit 5 and one sensor 14 adapted to measure physical values outside the module 2, the physical values used by the regulation unit 12 can be the pressure, the temperature inside the module unit 5 and outside the module unit 5, and the relative humidity inside the module unit 5. However, the disclosure is not limited to one sensor or one particular module unit. Pmod indicates the pressure inside the module unit 5. Pout indicates the pressure outside the module unit 5 corresponding to the ambient pressure. Tmod and rHmod indicate the temperature and the relative humidity inside the module, respectively. Tdp indicates the dew point temperature inside the module and can be determined from the values of Tmod and rHmod. The dew point temperature Tdp is the degree of temperature at which a part of the water vapor contained in a volume of air passes from gaseous to liquid form, which corresponds to condensation. Tout indicates the temperature outside the module.

As FIG. 3 schematically illustrates, the three different operating modes of the switching mechanism as shown in the respective FIGS. 2A-2C are associated to different conditions based on the measures of the various parameters indicated above.

In particular, when the pressure inside the module unit 5 Pmod is higher than the pressure outside the module unit 5 Pout, the operating mode of FIG. 2A applies. Gas is flowing from the module unit 5 to ambient atmosphere via the second duct 8 and the open second valve 9, but this may also take place via the above-described additional module non-return membrane, which allows over-pressure evacuation. The next step consists in an evaluation of the initial condition of pressure difference inside and outside the module unit 5.

In the case where the pressure, Pout, outside the module unit 5 is higher than the pressure, Pmod, inside the module unit 5, a second condition depending on the comparison of the temperature, Tout, outside the module unit 5 and the dew point temperature, Tdp, inside the module unit 5 is implemented. As mentioned before, at temperatures below the dew point temperature, condensation generally occurs. In order to avoid the critical point of the dew point temperature Tdp and condensation inside the module, a predetermined threshold of x° C. as indicated in FIG. 3, preferentially 2° C., is implemented in the second condition. When the temperature, Tout, outside the module unit 5 is exceeding the dew point temperature, Tdp, inside the module unit 5 by more than the predetermined threshold, preferentially 2° C., the operating mode of FIG. 2B applies. Gas is flowing from ambient atmosphere to the module unit 5 via the second duct 8 and the open second valve 9. However, when the temperature, Tout, outside the module unit 5 is approaching the dew point temperature, Tdp, inside the module unit 5 from higher temperatures by less than a predetermined threshold, preferentially 2° C., the operating mode of FIG. 2C applies. Gas is flowing from the desiccant unit 1 to the module unit 5 via the first duct 3 and the open first valve 4, providing dried gas from the desiccant unit 1 to the module unit 5. In both cases, depending on the second condition, the next step consists of an evaluation of the initial condition of pressure difference inside and outside the module unit 5.

The different operating modes of the switching mechanism depend on the measure of the sensors described before. In a non-limitative way, each module unit comprised in the module 2, can have its own set of sensors. The measure taken into account by the regulation unit 12 can be, for instance, a local value inside a specific module unit or an average value of all measured values of a set of sensors inside a module unit, but it can also be the average value of the whole module 2.

In an alternative, a third supplemental condition can be added, only taking into account the relative humidity level, rHout, outside the module. In particular, the operating mode of FIG. 2B could be allowed only if the pressure, Pout, outside the module unit 5 is higher than the pressure, Pmod, inside the module unit 5, the temperature, Tout, outside the module unit 5 is exceeding the dew point temperature, Tdp, inside the module unit 5 by more than a predetermined temperature threshold, preferentially 2° C., and the relative humidity level, rHout, outside the module is below a predetermined humidity threshold, preferentially 70%. This supplemental condition allows a gag flow from ambient atmosphere to the module unit 5, not only based on the dew point temperature, Tdp, inside the module unit 5, but also only allowing relatively dry air from the outside and, thus, avoiding entering excessively humid air from ambient atmosphere to the module unit 5. This provides the advantage to decouple the parameter of relative humidity from the mixed parameter of dew point temperature, allowing more flexibility. The operating mode of FIG. 2C would be allowed if the pressure, Pout, outside the module unit 5 is higher than the pressure, Pmod, inside the module unit 5, the temperature, Tout, outside the module unit 5 is exceeding the dew point temperature, Tdp, inside the module unit 5 by more than a predetermined temperature threshold, preferentially 2° C., and the relative humidity level, rHout, outside the module exceeds a predetermined humidity threshold, preferentially 70%. Even if practically no condensation would occur in the module unit 5, excessively humid air would be avoided entering the module unit 5.

In alternative embodiments, the working principle of the humidity-regulating device is based on the comparison of the physical values of only one sensor in a configuration similar to, for instance, FIGS. 1A to 1D omitting either the sensor 13 adapted to measure physical values with reference to the inside of the module 2 or the sensor 14 adapted to measure physical values with reference to the outside of the module 2, to a predetermined threshold, in particular, for the operating mode illustrated schematically in FIGS. 2B and 2C. In one alternative, the operating mode illustrated in FIG. 2C applies for the case that the temperature inside or outside the module, depending on which sensor 13, 14 is kept in place, is higher than the predetermined temperature threshold. In another alternative, the operating mode shown in FIG. 2C applies for the case that the relative humidity inside or outside the module, depending on which sensor 13, 14 is installed, is lower than the predetermined relative humidity threshold. In a further alternative, the operating mode illustrated in FIG. 2C applies for a combined measure of temperature and relative humidity, with the temperature inside or outside the module lower than the predetermined temperature threshold and the relative humidity inside or outside the module higher than the predetermined relative humidity threshold. These alternatives allow the provision of dried air to the module based on the measure of only one sensor, which simplifies the installation and the maintenance of the humidity-regulating device and the module. The predetermined temperature and relative humidity threshold can, for instance, be derived from temperature and relative humidity data already recorded for the specific geographic location of the photovoltaic installation. As already pointed out before in the description, the dew point temperature is derived from such combined measures of temperature and relative humidity, and for temperatures below this dew point temperature, condensation can occur. A possible way to identify the temperature and relative humidity thresholds relies, therefore, on the ensemble of combined data points of temperature and relative humidity, for example, throughout the year, which results in a mapping of the dew point temperature. The gas flow between the desiccant unit 1 and the module 2 could, therefore, be allowed if the outside or inside temperature of the module is lower than such a derived and, thus, predetermined threshold. The same reasoning can be applied, taking into account the relative humidity values only, deriving a threshold value for the relative humidity based on the mapping of dew point temperatures, taking into account the minimal temperature for each point, leading to a mapping of maximum relative humidity values. Thresholds based on the combined measures of temperature and relative humidity can be more precisely adjusted and, thus, the thresholds evaluated in a more narrow range, than thresholds based on temperature and relative humidity only. However, the latter can be of particular interest, for instance, in cases in which the annual variation of one or both values of temperature and relative humidity is negligible, such as, for instance, for countries close to the equator. Further, the temperature and relative humidity data not only includes the annual or seasonal parameters, but also even daily variations of the measured parameters. The humidity-regulating device, thus, could even adapt and change threshold values throughout the year in order to optimize the efficiency of the system because the critical conditions might differ, for example, with the different seasons.

All previously discussed embodiments are not intended as limitations but serve as examples illustrating features and advantages of the disclosure. It has to be understood that some or all of the above-described features can also be combined in different ways.

Although as illustrated in FIGS. 1A-1D, the device of this disclosure can comprise several desiccant units.

The invention claimed is:

1. A device to regulate the relative humidity level in a CPV module, comprising:
at least one module unit, the device comprising a desiccant unit connected to the CPV module via a duct, wherein the CPV module is also connectable to ambient atmosphere, and wherein the device comprises a switching mechanism that is actuated by a regulation unit, allowing a gas flow between the CPV module and either the desiccant unit or ambient atmosphere, wherein the CPV module is connected to ambient atmosphere via a second duct connected to the duct at an intersection, the duct being a first duct, the switching mechanism comprising a first valve placed on the first duct between the desiccant unit and the intersection, and comprising a second valve placed on the second duct between the intersection and the ambient atmosphere.

2. The humidity-regulating device according to claim 1, wherein the regulation unit comprises at least a sensor adapted for measuring physical values with reference to the inside of the CPV module or at least a sensor adapted for measuring physical values with reference to the outside of the CPV module, and wherein the regulation unit records and compares the measures with predetermined thresholds to actuate the switching mechanism.

3. The humidity-regulating device according to claim 1, wherein the regulation unit comprises at least a sensor adapted for measuring physical values with reference to the inside of the CPV module and at least a sensor adapted for measuring physical values with reference to the outside of the CPV module, and wherein the regulation unit records and compares their measures to actuate the switching mechanism.

4. The humidity-regulating device according to claim 2, wherein the gas flow between the CPV module and the desiccant unit is allowed when the regulation unit records a pressure in the CPV module inferior to the pressure outside the CPV module and the temperature inside or outside the CPV module is lower than the predetermined temperature threshold and/or the relative humidity inside or outside the CPV module is higher than the predetermined relative humidity threshold.

5. The humidity-regulating device according to claim 2, wherein the gas flow between the CPV module and ambient atmosphere is allowed when the regulation unit records a pressure in the CPV module inferior to the pressure outside the CPV module and the temperature inside or outside the CPV module is higher than the predetermined temperature threshold and/or the relative humidity inside or outside the CPV module is lower than the predetermined relative humidity threshold.

6. The humidity-regulating device according to claim 2 or claim 3, wherein the physical values can respectively be the temperature, relative humidity, and pressure, inside and/or outside the CPV module.

7. The humidity-regulating device according to claim 3, wherein the gas flow between the CPV module and the desiccant unit is allowed when the regulation unit records a pressure in the module inferior to the pressure outside the CPV module and a temperature outside the module that is approaching the dew point temperature inside the CPV module, the dew point being calculated from the measure of the temperature and relative humidity inside the CPV module, from higher temperatures by less than a predetermined threshold.

8. Humidity regulating device according to claim 7, the predetermined threshold for temperature is 2° C.

9. The humidity-regulating device according to claim 3, wherein the gas flow between the CPV module and the ambient atmosphere is allowed when the regulation unit records a pressure in the CPV module inferior to the pressure outside the CPV module and the outside temperature is exceeding the dew point temperature inside the CPV module, the dew point being calculated from the measure of the temperature and relative humidity inside the CPV module, by more than a predetermined threshold.

10. The humidity-regulating device according to claim 3, wherein the gas flow between the CPV module and the ambient atmosphere is allowed when the regulation unit records a pressure in the CPV module superior to the pressure outside the CPV module.

11. The humidity-regulating device according to claim 3, wherein the gas flow between the CPV module and the desiccant unit is allowed when the regulation unit records a pressure in the CPV module inferior to the pressure outside the CPV module and the outside temperature is exceeding the dew point temperature inside the CPV module, the dew point being calculated from the measure of the temperature and relative humidity inside the CPV module, by more than a predetermined threshold, and the relative humidity level outside the CPV module exceeds a predetermined threshold %.

12. Humidity regulating device according to claim 11, the predetermined threshold for relative humidity is 70%.

13. The humidity-regulating device according to claim 3, wherein the gas flow between the CPV module and the ambient atmosphere is allowed when the regulation unit records a pressure in the CPV module inferior to the pressure outside the CPV module and the outside temperature is exceeding the dew point temperature inside the CPV module, the dew point being calculated from the measure of the temperature and relative humidity inside the CPV module, by less than a predetermined threshold, and the relative humidity level outside the CPV module is inferior to a predetermined threshold.

14. Humidity regulating device according to claim 13, the predetermined threshold for relative humidity is 70%.

15. The humidity-regulating device according to claim 1, wherein the CPV module is connected to ambient atmosphere via a second duct connected to the duct at an intersection, the switching mechanism comprising an L-valve placed at the intersection.

16. The humidity-regulating device according to claim 1, wherein the CPV module is connected to ambient atmosphere via an opening placed on the module, the switching mechanism comprising valves placed on the duct and the opening.

17. The humidity-regulating device according to claim 1, further comprising a non-return membrane placed on at least one module unit able to evacuate overpressure from the inside of the CPV module to ambient atmosphere.

18. The humidity-regulating device according to claim 1, wherein the desiccant unit comprises an opening to ambient atmosphere, the opening comprising a third valve, which is opened only when the gas flow is allowed between the CPV module and the desiccant unit.

19. The humidity-regulating device according to claim 1, wherein the desiccant unit comprises an opening to ambient atmosphere, the opening comprising a non-return valve.

20. The humidity-regulating device according to claim 1, wherein a particle filter is placed on at least one of the connections to ambient atmosphere.

21. The humidity-regulating device according to claim 1, wherein the desiccant unit contains absorber and/or adsorber materials.

22. The humidity-regulating device according to claim 21, wherein the desiccant unit contains silica gel.

23. The humidity-regulating device according to claim 1, wherein the at least one module unit of the CPV module are connected in a gas conducting manner via a duct.

24. A humidity regulation process using the humidity-regulating device according to claim 1.

* * * * *

UNITED STATES PATENT AND TRADEMARK OFFICE
CERTIFICATE OF CORRECTION

PATENT NO. : 10,746,439 B2
APPLICATION NO. : 14/770403
DATED : August 18, 2020
INVENTOR(S) : Andreas Gombert, Jakob Stor and Cecile Taliercio It is certified that error appears in the above-identified patent and that said Letters Patent is hereby corrected as shown below:

In the Specification
Column 9, Line 55, change "a gag flow" to --a gas flow--

Signed and Sealed this
Seventeenth Day of November, 2020

Andrei Iancu
*Director of the United States Patent and Trademark Office*